(12) United States Patent
Sharfi

(10) Patent No.: US 8,967,903 B1
(45) Date of Patent: Mar. 3, 2015

(54) LOCKING DISPLACEABLE FRAME

(71) Applicant: General Micro Systems, Inc., Rancho Cucamonga, CA (US)

(72) Inventor: Benjamin K. Sharfi, Stuart, FL (US)

(73) Assignee: General Micro Systems, Inc., Rancho Cucamonga, CA (US)

( * ) Notice: Subject to any disclaimer, the term of this patent is extended or adjusted under 35 U.S.C. 154(b) by 59 days.

(21) Appl. No.: 13/921,964

(22) Filed: Jun. 19, 2013

Related U.S. Application Data

(60) Provisional application No. 61/661,944, filed on Jun. 20, 2012.

(51) Int. Cl.
*F16B 2/14* (2006.01)
*F16B 12/40* (2006.01)

(52) U.S. Cl.
CPC .................................. *F16B 12/40* (2013.01)
USPC ..................................................... 403/374.4

(58) Field of Classification Search
USPC ............................................ 403/374.1–374.4
See application file for complete search history.

(56) References Cited

U.S. PATENT DOCUMENTS

| | | | |
|---|---|---|---|
| 3,971,186 A * | 7/1976 | Havelka et al. ............ | 403/374.4 |
| 4,120,021 A | 10/1978 | Roush | |
| 4,318,157 A * | 3/1982 | Rank et al. ..................... | 361/704 |
| 4,480,287 A * | 10/1984 | Jensen ........................... | 361/707 |
| 4,751,963 A * | 6/1988 | Bui et al. ........................ | 165/80.2 |
| 4,775,260 A * | 10/1988 | Kecmer ...................... | 403/409.1 |
| 4,819,713 A * | 4/1989 | Weisman ...................... | 165/80.2 |
| 4,823,951 A * | 4/1989 | Colomina ...................... | 206/707 |
| 4,824,303 A * | 4/1989 | Dinger .............................. | 411/79 |
| 4,909,752 A * | 3/1990 | Hallum et al. ................. | 439/325 |
| 4,953,059 A | 8/1990 | McNulty | |
| 5,057,968 A * | 10/1991 | Morrison ....................... | 361/700 |
| 5,071,013 A * | 12/1991 | Peterson ........................ | 211/26 |
| 5,090,840 A * | 2/1992 | Cosenza .................... | 403/409.1 |
| 5,156,647 A * | 10/1992 | Ries ................................ | 411/75 |
| 5,211,496 A | 5/1993 | Hurowitz | |
| 5,224,016 A * | 6/1993 | Weisman et al. ............. | 361/728 |
| 5,253,963 A * | 10/1993 | Ries ................................ | 411/75 |
| 5,290,122 A * | 3/1994 | Hulme ....................... | 403/374.4 |
| 5,382,175 A | 1/1995 | Kunkel | |

(Continued)

FOREIGN PATENT DOCUMENTS

| | | |
|---|---|---|
| EP | 1853097 | 11/2007 |
| JP | 6252574 | 9/1994 |

(Continued)

*Primary Examiner* — Daniel P Stodola
*Assistant Examiner* — Daniel Wiley
(74) *Attorney, Agent, or Firm* — Rick Barnes

(57) ABSTRACT

A wedge-lock for a rack mount system having a top plate with slots formed in each end. A bottom plate is disposed adjacent the top plate, and has an incline surface at each end, with a channel formed between the two inclines. Wedge blocks are disposed between the top plate and the bottom plate, with one wedge block at each end. Each wedge block includes an incline surface, a receiving channel formed from the incline surface to an opposing end surface, and a guide for engaging the slot of the top plate. A tensioning member passes through the receiving channels of the wedge blocks and the channel of the bottom plate, thereby retaining the wedge blocks to the bottom plate. As the tensioning member is tensioned, the incline surfaces of the wedge blocks ride up on the incline surfaces at both ends of the bottom plate and cause the top plate to be forced away from the bottom plate.

18 Claims, 4 Drawing Sheets

(56) References Cited

U.S. PATENT DOCUMENTS

| | | | |
|---|---|---|---|
| 5,407,297 A * | 4/1995 | Hulme et al. | 403/409.1 |
| 5,483,420 A * | 1/1996 | Schiavini | 361/707 |
| 5,607,273 A * | 3/1997 | Kecmer et al. | 411/79 |
| 5,711,628 A * | 1/1998 | Fletcher | 403/5 |
| 5,779,388 A * | 7/1998 | Yamamoto | 403/374.1 |
| 6,687,130 B2 * | 2/2004 | Adams et al. | 361/740 |
| 6,707,670 B2 * | 3/2004 | Seal | 361/704 |
| 7,349,221 B2 * | 3/2008 | Yurko | 361/719 |
| 7,883,289 B2 * | 2/2011 | Weisman | 403/374.4 |
| 8,045,332 B2 * | 10/2011 | Lee et al. | 361/759 |
| 2006/0133033 A1 | 6/2006 | Straub et al. | |
| 2010/0020514 A1 | 1/2010 | Lee et al. | |

FOREIGN PATENT DOCUMENTS

| | | |
|---|---|---|
| WO | 0004810 | 2/2000 |
| WO | 2011090920 | 7/2011 |

* cited by examiner

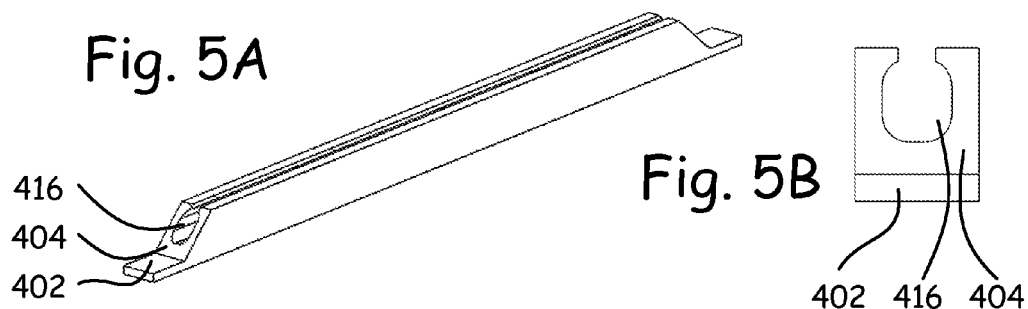
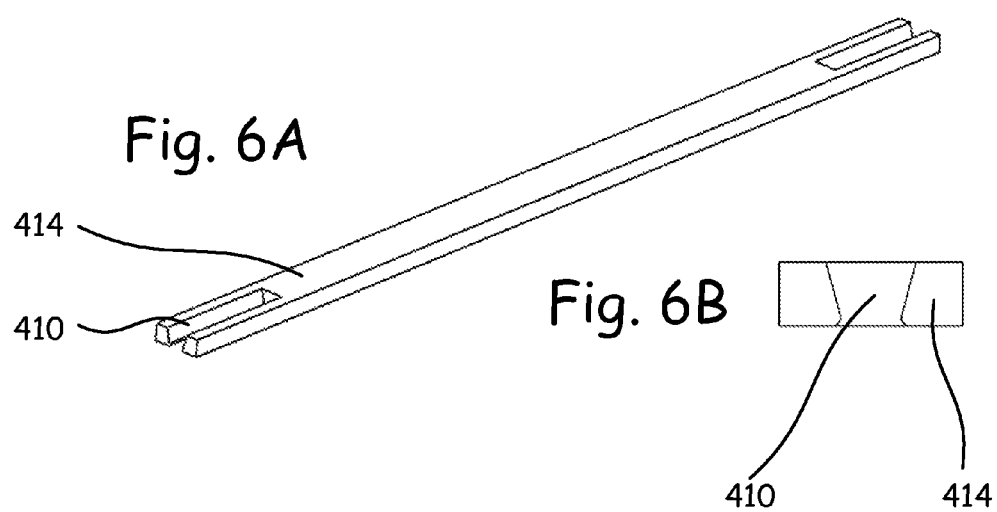
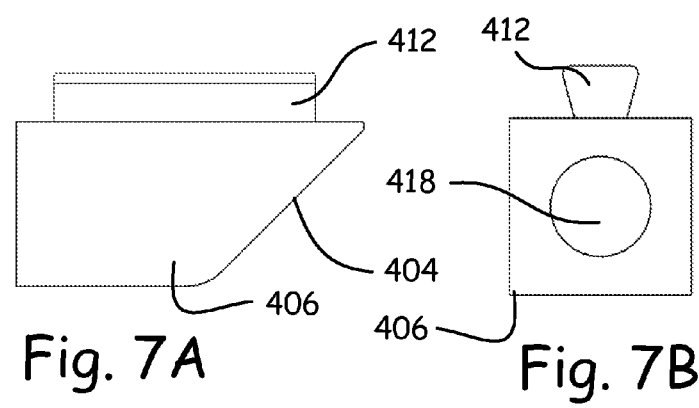

LOCKING DISPLACEABLE FRAME

This application claims rights and priority on prior U.S. provisional patent application Ser. No. 61/661,944 filed 2012, Jun. 20. This invention relates to the field of rack-mount systems. More particularly, this invention relates to a wedge lock that provides for enhanced heat transfer between the rack-mount device and the rack-mount chassis, and other benefits.

FIELD

Introduction

Wedge locks are used to retain an electronic card device, such as a computer, in a rack-mount chassis. Wedge locks are especially appropriate for environments where the card device might come loose from the chassis.

Prior art wedge locks are typically in the form of a series of wedge-shaped blocks in a line, with an adjustable member that extends through the blocks. The rails of the card device are placed into the slots in the chassis, and a wedge lock is placed into the slot on top of the card device rail. The adjustable member is tightened, drawing the wedge blocks against one another and causing them to slide against each other, making the wedge lock thicker and clamping the card device rail against the bottom of the slot in the chassis. The force of the wedge lock helps to retain the card device in the chassis.

What is needed, however, is a lock that improves upon the benefits of current wedge lock designs, at least in part.

SUMMARY OF THE CLAIMS

The above and other needs are met by a wedge-lock for a rack mount system having an elongate top plate with two ends, with retaining guide slots formed in each of the two ends. Also included is an elongate bottom plate with two ends, which is disposed adjacent the top plate. The bottom plate has an incline surface at each of the two ends, with a retaining channel formed between the two incline surfaces. The bottom plate and the top plate are separate plates. Two wedge blocks are disposed between the top plate and the bottom plate, with one each of the two wedge blocks disposed at each of the two ends. Each wedge block includes the following: an incline surface disposed adjacent one of the incline surfaces of the bottom plate; a receiving channel formed from the incline surface of the wedge block to an opposing end surface of the wedge block; and a retaining guide member for engaging the retaining guide slot of the top plate and being slidably retained thereby. A tensioning member passes through the receiving channels of the wedge blocks and the retaining channel of the bottom plate, thereby retaining the wedge blocks to the bottom plate. As the tensioning member is tensioned, the incline surfaces of the wedge blocks ride up on the incline surfaces at both ends of the bottom plate and cause the top plate to be forced away from the bottom plate.

In this manner, both the top plate and the bottom plate make thermal contact with the rails of the rack-mount chassis in which the wedge-lock is disposed, thus enabling enhanced thermal communication between the rack-mount device that is secured by the wedge-lock and the rack-mount chassis.

In various embodiments, a separation member is disposed between the top plate and the bottom plate, and provides separation forces between the top place and the bottom plate. In some embodiments the separation member is a coil spring. In some embodiments the separation member is a leaf spring. In some embodiments the separation member is a compressed thermoplastic resin member. In some embodiments the tensioning member is a threaded rod. In some embodiments the top plate and bottom plate are both formed of metal. In some embodiments the wedge blocks are both formed of a thermoplastic resin having a coefficient of friction that is less than that of the top plate and the bottom plate.

Also described is a rack-mount device having a top casing and a bottom casing, with an enclosed device chamber disposed between the top casing and the bottom casing, where the top casing is integrally formed with a top plate such as described above and elsewhere herein, and the bottom casing is integrally formed with a bottom plate such as described above and elsewhere herein.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIGS. 5A and 5B are a perspective view and an elevational view respectively of a bottom plate of a lock according to an embodiment of the present invention.

FIGS. 6A and 6B are a perspective view and an elevational view respectively of a top plate of a lock according to an embodiment of the present invention.

FIGS. 7A and 7B are a perspective view and an elevational view respectively of a wedge block of a lock according to an embodiment of the present invention.

DETAILED DESCRIPTION

Figure 1:
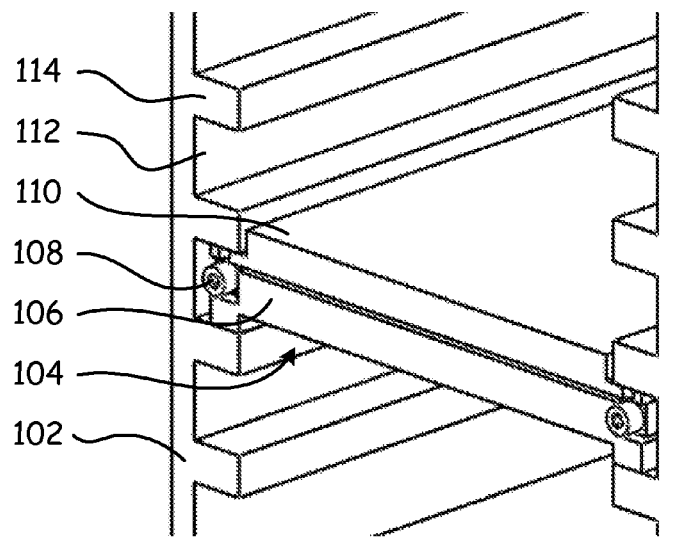
FIG. 1 is a perspective view of rack-mount system, including a rack-mount chassis, a rack-mount device, and a lock according to an embodiment of the present invention.
Figure 2:
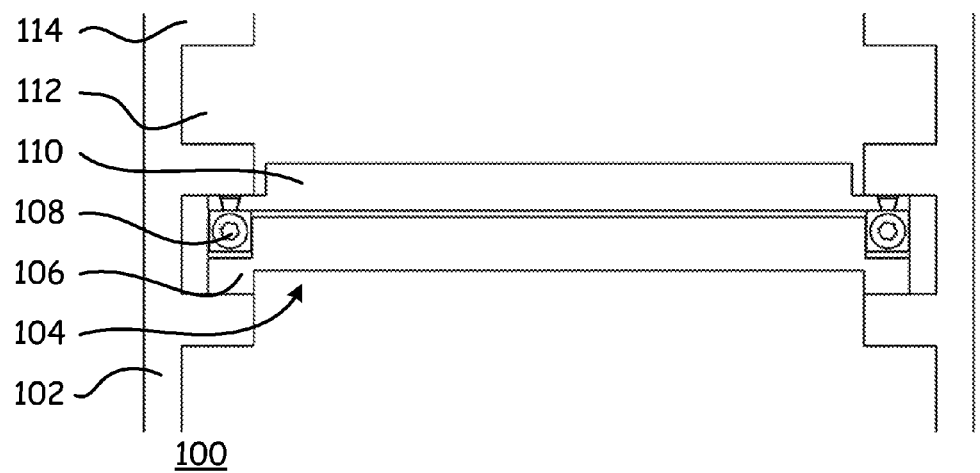
FIG. 2 is a front elevational view of rack-mount system, including a rack-mount chassis, a rack-mount device, and a lock according to an embodiment of the present invention.
Figure 3:
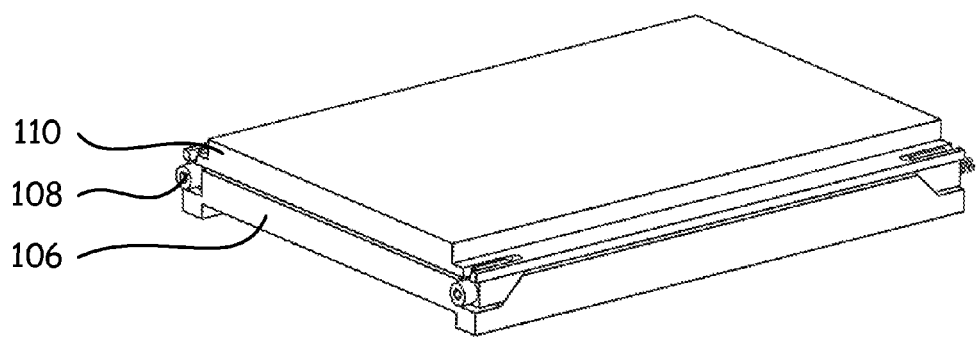
FIG. 3 is a perspective view of a rack-mount device and a lock according to an embodiment of the present invention, without the rack-mount chassis, so as to better see various aspects of the embodiment.

With reference now to the figures, there is described a rack-mount system 100, including chassis 102 having rails 114 that form slots 112 for receiving a card device 104. A wedge-lock 108 is either used in conjunction with the card device 104, or is integrally formed with the card device 104. FIGS. 1-3 generally depict an embodiment where the wedge-lock 108 is integrally formed with the device 104, and FIGS. 4-6 and 8-10 generally depict an embodiment where the wedge-lock 108 is separate from and used in conjunction with the card device 104. In either embodiment, the wedge-lock 108 helps to lock the card device 104 into the chassis, and also enhances the heat transfer between the card device 104 and the chassis 102, which aides in the cooling of the card device 104 during operation.

In the embodiment depicted in FIG. 3, the wedge-lock 108 is incorporated into the card device 104 enclosure. The card device 104 has a top plate 110 that is thermally conductive and a bottom plate 106 that is thermally conductive. The edges of both the top plate 110 and the bottom plate 106, often referred to as rails herein, fit into the two side slots 112 of the chassis 102. In this embodiment, the top plate 414 of the wedge-lock 108 is incorporated into the top plate 110 of the card device 104, and the bottom plate 402 of the wedge-lock 108 is incorporated into the bottom plate 106 of the card device 104.

Figure 4:
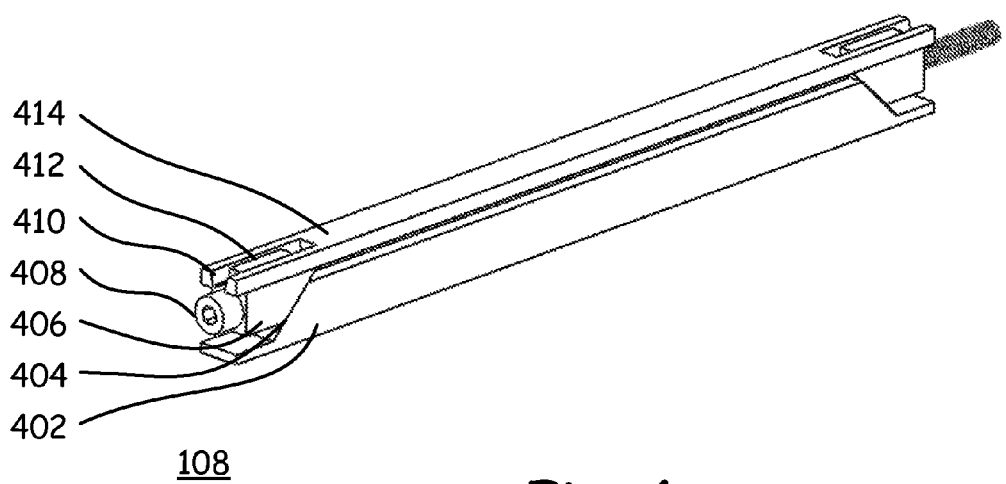
FIG. 4 is a perspective view of a lock according to an embodiment of the present invention.

With reference now to FIG. 4, the wedge-lock 108 itself is described in more detail. The wedge-lock 108 has a bottom plate 402, which in some embodiments is sized to fit within the slots 112 of the chassis 102 and run the entire length of the card device 104. At either end of the bottom plate 402 there is formed an incline surface 404. Running down through the center of the bottom plate 402 is a retaining slot, channel, or bore 416, as depicted in FIGS. 5A and 5B. The retaining channel 416 can be a slot that is open on both ends and on one side of the bottom plate 402, or can be a bore that is only open on the two ends.

A top plate 414 is provided, which in some embodiments is also sized to fit within the slot 112 of a chassis 102, and have substantially the same length as the card device 104, and also in some embodiments is sized to have substantially the same width and length as the bottom plate 402. The top plate 414 has a retaining channel 410 formed in it. In some embodiments the retaining channel 410 is separately formed in two parts, at either end of the top plate 414. In some embodiments the retaining channel 410 is formed with inclined surfaces as depicted in FIG. 6B, so that a wedge-shaped retaining member disposed within the retaining channel 410 would be retained thereby.

One or more wedge blocks 406 are disposed between the top plate 414 and the bottom plate 402. In some embodiments, two wedge blocks 406 are provided, with one wedge block 406 disposed at either end of the wedge lock 108. Each wedge block 406 is provided with an incline surface 404, which in some embodiments matches the incline surface 404 of the bottom plate 402. A retaining channel 418 is disposed in the wedge block 406, as depicted in FIG. 7B. In some embodiments the retaining channel 418 is formed from the incline surface 404 of the wedge block 406 to an opposing end of the wedge block 406.

The wedge block 406 in some embodiments includes a retaining guide member 412. In some embodiments, the retaining guide member 412 is sized to fit within the retaining slot 410 of the top plate 414. In one embodiment, the retaining guide member 412 is wedge-shaped, as depicted in FIG. 7B, to match the tapered and inclined surfaces of the retaining slot 410 of the top plate 414. The retaining guide member 412 in some embodiments can slide into an open end of the retaining slot 410. In this manner, the retaining guide member 412 can slide back and forth along a partial length of the top plate 414 within the retaining slot 410, and yet be retained to the top plate 414.

A tensioning member 408 is provided, as best depicted in FIG. 4, and in one embodiment is positioned to pass through the retaining channel 418 of a first wedge block 406, through the retaining channel 416 of the bottom plate 402, and then through the retaining channel 418 of a second wedge block 406. In some embodiments, the tensioning member 408 is a threaded rod with retainers such as nuts disposed on each end. By selectively loosening and tightening the nuts, the length of the tensioning member 408 can be increased or decreased as desired. In other embodiments, the tensioning member 408 is a rod with a cam lock on one or both ends, such that rotating a lever on the cam serves to selectively loosen or tighten the tensioning member 408.

In one embodiment, the wedge lock 108 is assembled as follows. One wedge block 406 is slotted onto each end of the top plate 414 by engaging the retaining guide member 412 of the wedge block 406 with the retaining guide slot 410 of the top plate 414, such that the incline surfaces 404 of the two wedge blocks 406 are facing toward each other and away from the ends of the top plate 414. The top plate 414 with the wedge blocks 406 are then brought into proximity with the bottom plate 402. The tensioning member 408 is slotted through the retaining channel 418 of a first wedge block 406, through the retaining channel 416 of the bottom plate 402, and then through the retaining channel 418 of a second wedge block 406, in the configuration such as depicted in FIG. 4.

In this manner, when the tensioning member 408 is shortened, the incline surfaces 404 of the wedge blocks 406 ride up on the incline surfaces 404 of the bottom plate 402, causing the bottom plate 402 and the top plate 414 to separate one from another. This separation causes the wedge lock 108 to compact against adjacent rails 114 within the slot 112 of the chassis 102, thereby helping to retain the card device 104 within the chassis 102.

By forming the top plate 414 and the bottom plate 402 of materials with relatively high thermal conductivity, such as a metal, the heat transfer through the wedge lock 108 and into the rails 114 of the chassis 102 is increased, which can help cool the card device 104. Further, by incorporating the wedge lock 108 into the card device 104, such as by integrating the top plate 414 of the wedge lock 108 into the top plate 110 of the card device 104 and incorporating the bottom plate 402 of the wedge lock 108 into the bottom plate 106 of the card device 104, the heat transfer from the card device 104 to the chassis 102 is greatly increased. Thus, various embodiments not only improve the mechanical stability of the card device 104, but also improve the removal of the thermal load from the card device 104.

Figure 8:
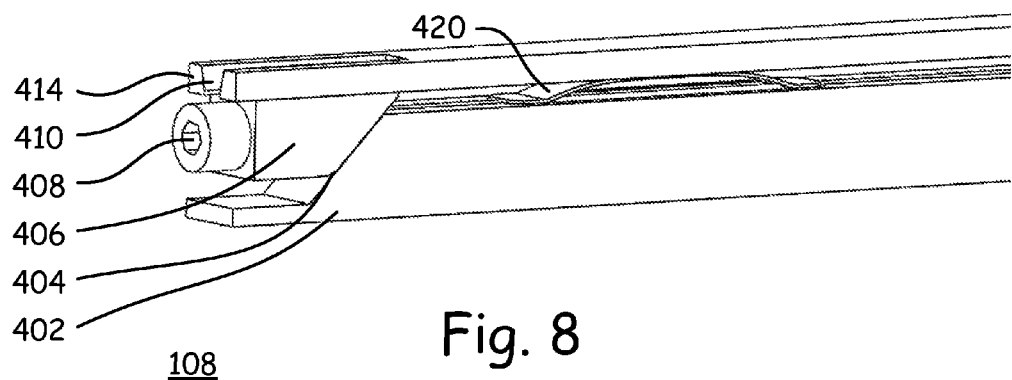
FIG. 8 is a partial perspective view of a separation member of a lock according to a first embodiment of the present invention.
Figure 9:
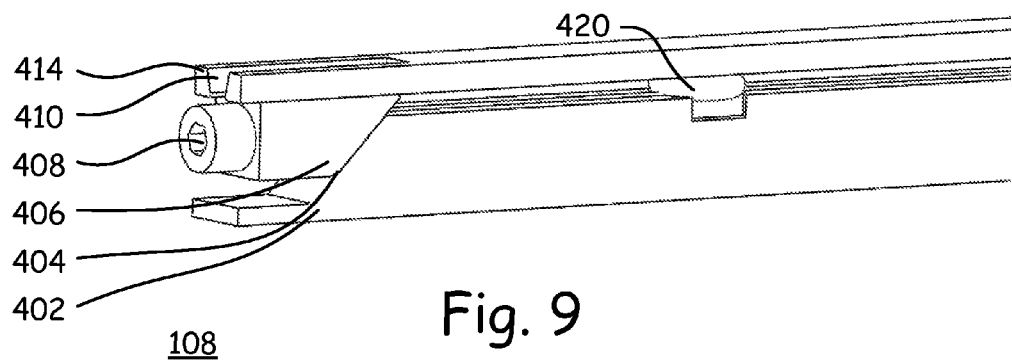
FIG. 9 is a partial perspective view of a separation member of a lock according to a second embodiment of the present invention.
Figure 10:
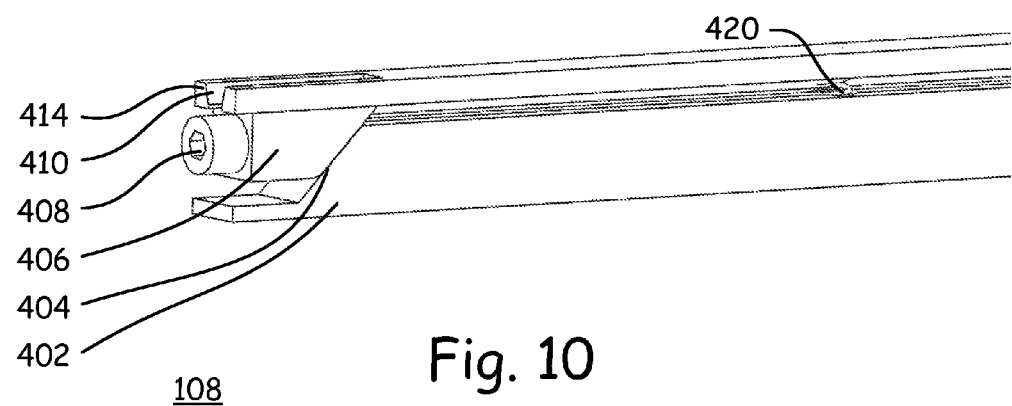
FIG. 10 is a partial perspective view of a separation member of a lock according to a third embodiment of the present invention.

As depicted in FIGS. 8-10, some embodiments include a separation member 420, such as a leaf spring, coil spring, or O-ring, that keeps the top plate 414 and the bottom plate 402 separated by some amount of space, even when the wedge blocks 406 are not applying force between the top plate 414 and the bottom plate 402.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A wedge-lock for mounting in a chassis, the wedge-lock comprising:
   an elongate top plate with two ends and a top length extending linearly substantially completely between the two ends, with retaining guide slots formed in each of the two ends,
   an elongate bottom plate, with two ends and a bottom length extending linearly substantially completely between the two ends, disposed adjacent the top plate, the bottom plate having an incline surface at each of the two ends, with a retaining channel formed between the two incline surfaces, the bottom plate and the top plate being separate plates,
   two wedge blocks disposed between the top plate and the bottom plate, with one each of the two wedge blocks disposed at each of the two ends, each wedge block having,
      an incline surface disposed adjacent one of the incline surfaces of the bottom plate,
      a receiving channel formed from the incline surface of the wedge block to an opposing end surface of the wedge block, and
      a retaining guide member for engaging the retaining guide slot of the top plate and being slidably retained thereby, and
   a tensioning member passing through the receiving channels of the wedge blocks and the retaining channel of the bottom plate, thereby retaining the wedge blocks to the bottom plate,
   such that as the tensioning member is tensioned, the incline surfaces of the wedge blocks ride up on the incline surfaces at both ends of the bottom plate and cause the top plate to be forced away from the bottom plate, and the top length and bottom length are substantially entirely in contact with the chassis.

2. The wedge-lock of claim 1, further comprising a separation member disposed between the top plate and the bottom plate, the separation member providing separation forces between the top plate and the bottom plate.

3. The wedge-lock of claim 2, wherein the separation member is a coil spring.

4. The wedge-lock of claim 2, wherein the separation member is a leaf spring.

5. The wedge-lock of claim 2, wherein the separation member is a compressed thermoplastic resin member.

6. The wedge-lock of claim 1, wherein the tensioning member is a threaded rod.

7. The wedge-lock of claim 1, wherein the top plate and bottom plate are both formed of metal.

8. The wedge-lock of claim 1, wherein the wedge blocks are both formed of a thermoplastic resin having a coefficient of friction that is less than that of the top plate and the bottom plate.

9. A rack-mount device having a top casing and a bottom casing, where the top casing is integrally formed with the top plate of claim 1, and the bottom casing is integrally formed with the bottom plate of claim 1, and an enclosed device chamber disposed between the top casing and the bottom casing.

10. A rack-mount device for mounting within a chassis, comprising:
   a top casing with two side rails, each side rail forming an elongate top plate with two ends and a top length extending linearly substantially completely between the two ends, with retaining guide slots formed in each of the two ends,
   a bottom casing with two side rails, each side rail forming an elongate bottom plate with two ends and a bottom length extending linearly substantially completely between the two ends, disposed adjacent the top plate, the bottom plate having an incline surface at each of the two ends, with a retaining channel formed between the two incline surfaces, the bottom casing and the top casing being separate casings,
   an enclosed device chamber disposed between the top casing and the bottom casing,
   two wedge blocks disposed between the top plate and the bottom plate, with one each of the two wedge blocks disposed at each of the two ends, each wedge block having,
      an incline surface disposed adjacent one of the incline surfaces of the bottom plate,
      a receiving channel formed from the incline surface of the wedge block to an opposing end surface of the wedge block, and
      a retaining guide member for engaging the retaining guide slot of the top plate and being slidably retained thereby, and
   a tensioning member passing through the receiving channels of the wedge blocks and the retaining channel of the bottom plate, thereby retaining the wedge blocks to the bottom plate,
   such that as the tensioning member is tensioned, the incline surfaces of the wedge blocks ride up on the incline surfaces at both ends of the bottom plate and cause the top plate to be forced away from the bottom plate, and the top length and bottom length are substantially entirely in contact with the chassis.

11. The rack-mount device of claim 10, further comprising a separation member disposed between the top plate and the bottom plate, the separation member providing separation forces between the top place and the bottom plate.

12. The rack-mount device of claim 11, wherein the separation member is a coil spring.

13. The rack-mount device of claim 11, wherein the separation member is a leaf spring.

14. The rack-mount device of claim 11, wherein the separation member is a compressed thermoplastic resin member.

15. The rack-mount device of claim 10, wherein the tensioning member is a threaded rod.

16. The rack-mount device of claim 10, wherein the top plate and bottom plate are both formed of metal.

17. The rack-mount device of claim 10, wherein the wedge blocks are both formed of a thermoplastic resin having a coefficient of friction that is less than that of the top plate and the bottom plate.

18. A rack-mount device for mounting within a chassis, comprising:
   a metal top casing with two side rails, each side rail forming an elongate top plate with two ends and a top length extending linearly substantially completely between the two ends, with retaining guide slots formed in each of the two ends,
   a metal bottom casing with two side rails, each side rail forming an elongate bottom plate with two ends and a bottom length extending linearly substantially completely between the two ends, disposed adjacent the top plate, the bottom plate having an incline surface at each of the two ends, with a retaining channel formed between the two incline surfaces, the bottom casing and the top casing being separate casings,
   an enclosed device chamber disposed between the top casing and the bottom casing, two wedge blocks formed of a thermoplastic resin having a coefficient of friction that is less than that of the top plate and the bottom plate, the wedge blocks disposed between the top plate and the bottom plate, with one each of the two wedge blocks disposed at each of the two ends, each wedge block having,
  an incline surface disposed adjacent one of the incline surfaces of the bottom plate,
  a receiving channel formed from the incline surface of the wedge block to an opposing end surface of the wedge block, and
  a retaining guide member for engaging the retaining guide slot of the top plate and being slidably retained thereby,
a separation member disposed between the top plate and the bottom plate, the separation member providing separation forces between the top plate and the bottom plate, wherein the separation member includes at least one of a coil spring, a leaf spring, and a compressed thermoplastic resin member,
a threaded rod passing through the receiving channels of the wedge blocks and the retaining channel of the bottom plate, thereby retaining the wedge blocks to the bottom plate,
such that as the threaded rod is tensioned, the incline surfaces of the wedge blocks ride up on the incline surfaces at both ends of the bottom plate and cause the top plate to be forced away from the bottom plate, and the top length and bottom length are substantially entirely in contact with the chassis.

\* \* \* \* \*